(12) United States Patent
Kim et al.

(10) Patent No.: US 10,649,567 B2
(45) Date of Patent: May 12, 2020

(54) DISPLAY APPARATUS WITH INTEGRATED TOUCH SCREEN

(71) Applicant: LG Display Co., Ltd., Seoul (KR)

(72) Inventors: Byonghoo Kim, Paju-si (KR); Sangheun Lee, Seoul (KR); Jeonghoon Lee, Gimpo-si (KR); Sungjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 28 days.

(21) Appl. No.: 16/015,634

(22) Filed: Jun. 22, 2018

(65) Prior Publication Data

US 2018/0373372 A1 Dec. 27, 2018

(30) Foreign Application Priority Data

Jun. 23, 2017 (KR) .......................... 10-2017-0079693

(51) Int. Cl.
| | | |
|---|---|---|
| *G06F 3/041* | (2006.01) | |
| *G06F 3/044* | (2006.01) | |
| *H01L 51/52* | (2006.01) | |
| *H01L 27/32* | (2006.01) | |

(52) U.S. Cl.
CPC ............ *G06F 3/0412* (2013.01); *G06F 3/044* (2013.01); *H01L 27/323* (2013.01); *H01L 51/5253* (2013.01); *H01L 27/3244* (2013.01)

(58) Field of Classification Search
CPC ..... G06F 3/0412; G06F 3/044; H01L 27/323; H01L 51/5253
See application file for complete search history.

(56) References Cited

U.S. PATENT DOCUMENTS

| | | | |
|---|---|---|---|
| 9,671,914 B2* | 6/2017 | Kim ........................ | G06F 3/044 |
| 9,904,428 B2 | 2/2018 | Schardt et al. | |
| 2006/0068190 A1* | 3/2006 | Goodner ........... | H01L 21/02126 428/307.3 |
| 2014/0042398 A1* | 2/2014 | Choi ................... | H01L 27/3244 257/40 |
| 2014/0248489 A1* | 9/2014 | Higashi ................. | C09J 133/14 428/355 AC |
| 2014/0265822 A1* | 9/2014 | Drzaic ............... | H01L 51/5281 313/504 |
| 2015/0333293 A1* | 11/2015 | Poon ................... | H01L 51/5253 257/40 |
| 2016/0368250 A1* | 12/2016 | Di .......................... | G06F 3/041 |

(Continued)

FOREIGN PATENT DOCUMENTS

| | | |
|---|---|---|
| TW | 201623385 A | 7/2016 |
| TW | 201624780 A | 7/2016 |

*Primary Examiner* — Ricardo Osorio
(74) *Attorney, Agent, or Firm* — Polsinelli PC

(57) ABSTRACT

Disclosed is a display apparatus with integrated touch screen, in which a relative permittivity of an encapsulation layer is reduced, thereby increasing touch sensitivity. The display apparatus with integrated touch screen includes a light emitting layer disposed on a lower substrate, an encapsulation layer disposed on the light emitting layer, and a touch electrode disposed on the encapsulation layer. The encapsulation layer includes a first elastic layer disposed on the light emitting layer, a low dielectric layer disposed on the first elastic layer, and a second elastic layer disposed on the low dielectric layer. A relative permittivity of the low dielectric layer is 2.5 to 2.8.

20 Claims, 4 Drawing Sheets

(56) References Cited

U.S. PATENT DOCUMENTS

| | | | |
|---|---|---|---|
| 2017/0038874 A1* | 2/2017 | Lin | G06F 3/0412 |
| 2017/0113443 A1* | 4/2017 | Yang | B32B 17/10 |
| 2017/0154939 A1* | 6/2017 | Song | H01L 25/167 |
| 2017/0285751 A1 | 10/2017 | Nakano et al. | |
| 2018/0007747 A1* | 1/2018 | Jung | H01L 51/5253 |
| 2018/0130966 A1* | 5/2018 | Yun | H01L 27/3246 |
| 2019/0153151 A1* | 5/2019 | Cho | C08G 59/40 |

* cited by examiner

DISPLAY APPARATUS WITH INTEGRATED TOUCH SCREEN

CROSS REFERENCE TO RELATED APPLICATION

This application claims the benefit of the Korean Patent Application No. 10-2017-0079693 filed on Jun. 23, 2017, which is hereby incorporated by reference in its entirety as if fully set forth herein.

BACKGROUND

Field of the Disclosure

The present disclosure relates to a display device, and more particularly, to a display apparatus with integrated touch screen. Although the present disclosure is suitable for a wide scope of applications, it is particularly suitable for increasing touch sensitivity by reducing a relative permittivity of an encapsulation layer of a display apparatus with an integrated touch screen.

Description of the Background

With the advancement of information-oriented society, various requirements for display apparatuses for displaying an image have been increasing. Field emission display apparatuses among the display apparatuses are apparatuses where a light emitting layer is provided between two electrodes and emits light with an electrical field generated between the two electrodes, thereby displaying an image.

As a type of field emission display apparatus, display apparatuses with integrated touch screen each include a touch screen panel for sensing a user touch. The display apparatuses with integrated touch screen enable a user to directly input information with a finger or a pen, and thus, are widely applied to navigation devices, portable terminals, home appliances, etc.

The display apparatuses with integrated touch screen each include a light emitting layer disposed on a lower substrate, an encapsulation layer disposed on the light emitting layer, and a touch electrode disposed on the encapsulation layer. Typically, the encapsulation layer has a relative permittivity of 3.4 to 3.6.

The relative permittivity of the encapsulation layer is proportional to a capacitance provided between the light emitting layer and the touch electrode, and a touch sensitivity of the touch electrode is inversely proportional to the square of a capacitance. The conventional encapsulation layer has a high relative permittivity, thereby inevitably causing a reduction in touch sensitivity.

SUMMARY

Accordingly, the present disclosure is directed to provide a display apparatus with integrated touch screen that substantially obviates one or more problems due to limitations and disadvantages of the related art.

An aspect of the present disclosure is directed to provide a display apparatus with integrated touch screen, in which a relative permittivity of an encapsulation layer is reduced, thereby increasing touch sensitivity.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus with integrated touch screen including a light emitting layer disposed on a lower substrate, an encapsulation layer disposed on the light emitting layer, and a touch electrode disposed on the encapsulation layer. The encapsulation layer includes a first elastic layer disposed on the light emitting layer, a low dielectric layer disposed on the first elastic layer, and a second elastic layer disposed on the low dielectric layer. A relative permittivity of the low dielectric layer is 2.5 to 2.8.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

In the drawings.

DETAILED DESCRIPTION OF THE DISCLOSURE

Figure 1:
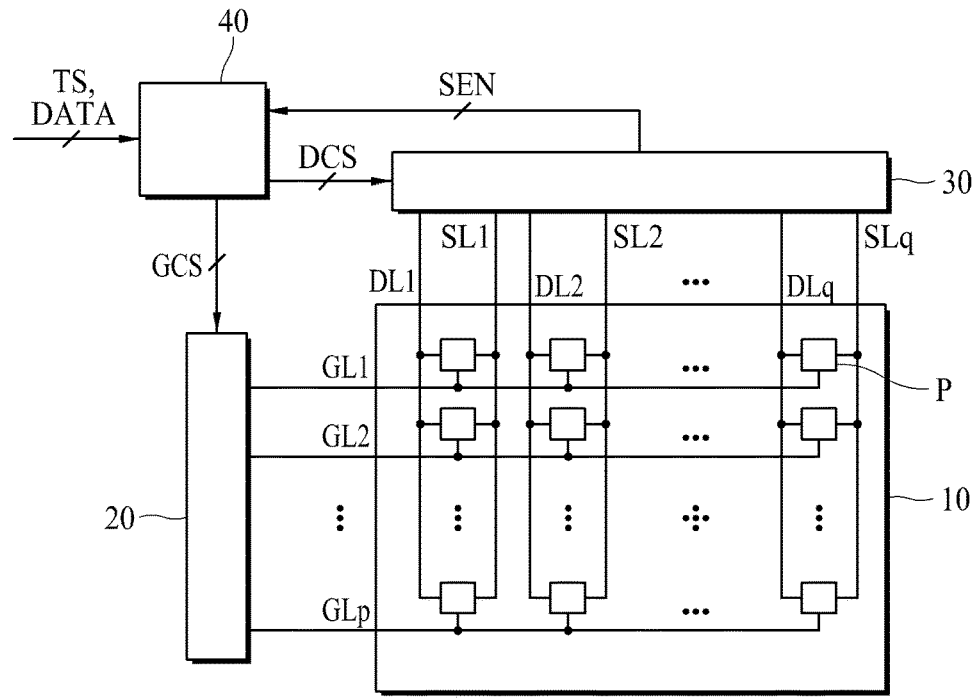
FIG. 1 is a conceptual block diagram of a display apparatus with integrated touch screen according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a display apparatus with integrated touch screen according to the present disclosure will be described in detail with reference to the accompanying drawings.

Figure 2:
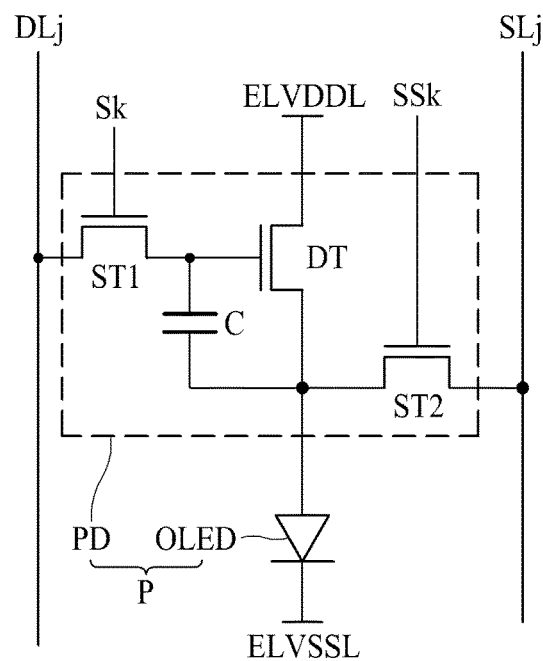
FIG. 2 is an internal circuit diagram of a pixel according to an embodiment of the present disclosure.

FIG. 1 is a conceptual block diagram of a display apparatus with integrated touch screen according to an embodiment of the present disclosure. FIG. 2 is an internal circuit diagram of a pixel according to an embodiment of the present disclosure.

Referring to FIGS. 1 and 2, an organic light emitting display apparatus according to an embodiment of the present disclosure may include a display panel 10, a gate driver 20, a data driver 30, and a timing controller 40.

The display panel 10 includes a display area and a non-display area provided near the display area. The display area may be an area where pixels are provided to display an image. The non-display area may be an area which configures a border of the display panel 10 and protects the display area from external impact. A plurality of gate lines GL1 to GLp (where p is a positive integer equal to or more than two), a plurality of data lines DL1 to DLq (where q is a positive integer equal to or more than two), and a plurality of sensing lines SL1 to SLq may be provided in the display panel 10. The data lines DL1 to DLq and the sensing lines SL1 to SLq may intersect the gate lines GL11 to GLp. The data lines DL1 to DLq and the sensing lines SL1 to SLq may be parallel to each other. The display panel 10 may include a lower substrate, on which the pixels P are provided, and an upper substrate which performs an encapsulation function for protecting the pixels P from external particles.

Each of the pixels may be connected to one corresponding gate line of the gate lines GL1 to GLp, one corresponding data line of the data lines DL1 to DLq, and one corresponding sensing line of the sensing lines SL1 to SLq. The pixels P, as in FIG. 2, may each include an organic light emitting diode OLED and a pixel driver PD which supplies a current to the organic light emitting diode OLED. In FIG. 2, for convenience of description, only a pixel P connected to a $j^{th}$ (where j is a positive integer satisfying 1≤j≤q) data line DLj, a $j^{th}$ sensing line SLj, a $k^{th}$ (where k is a positive integer satisfying 1≤k≤p) scan line (or a gate line) Sk, and a kth sensing signal line SSk is illustrated.

Referring to FIG. 2, the pixel P may include the organic light emitting diode OLED and the pixel driver PD that supplies a current to the organic light emitting diode OLED and the jth sensing line SLj.

The organic light emitting diode OLED may emit light with the current supplied through a driving transistor DT. An anode electrode of the organic light emitting diode OLED may be connected to a source electrode of the driving transistor DT, and a cathode electrode may be connected to a low level voltage line ELVSSL through which a low level voltage lower than a high level voltage is supplied.

The organic light emitting diode OLED may include the anode electrode, a hole transporting layer, an organic light emitting layer, an electron transporting layer, and the cathode electrode. When a voltage is applied to the anode electrode and the cathode electrode, a hole and an electron may respectively move to the organic light emitting layer through the hole transporting layer and the electron transporting layer and may be combined with each other in the organic light emitting layer to emit light.

The pixel driver PD may include the driving transistor DT, a first transistor ST1 controlled by a scan signal of the kth scan line Sk, a second transistor ST2 controlled by a sensing signal of the kth sensing signal line SSk, and a capacitor C. In a display mode, when the scan signal is supplied through the $k^{th}$ scan line Sk connected to the pixel P, the pixel driver PD may be supplied with a data voltage VDATA of the $j^{th}$ data line DLj connected to the pixel P and may supply a current of the driving transistor DT to the organic light emitting diode OLED, based on the data voltage VDATA. In a sensing mode, when the scan signal is supplied through the $k^{th}$ scan line Sk connected to the pixel P, the pixel driver PD may be supplied with a sensing voltage of the $j^{th}$ data line DLj connected to the pixel P and may supply the current of the driving transistor DT to the $j^{th}$ sensing line SLj connected to the pixel P.

The driving transistor DT may be provided between the high level voltage line ELVDDL and the organic light emitting diode OLED. The driving transistor DT may control a current flowing from the high level voltage line ELVDDL to the organic light emitting diode OLED, based on a voltage difference between a gate electrode and a source electrode of the driving transistor DT. The gate electrode of the driving transistor DT may be connected to a first electrode of the first transistor ST1, the source electrode may be connected to the anode electrode of the organic light emitting diode OLED, and a drain electrode may be connected to the high level voltage line ELVDDL through which the high level voltage is supplied.

The first transistor ST1 may be turned on by a $k^{th}$ scan signal of the $k^{th}$ scan line Sk and may supply a data voltage of the $j^{th}$ data line DLj to the gate electrode of the driving transistor DT. A gate electrode of the first transistor ST1 may be connected to the $k^{th}$ scan line Sk, a first electrode may be connected to the gate electrode of the driving transistor DT, and a second electrode may be connected to the $j^{th}$ data line DLj. The first transistor ST1 may be referred to as a scan transistor.

The second transistor ST2 may be turned on by a $k^{th}$ sensing signal of the $k^{th}$ sensing signal line SSk and may connect the $j^{th}$ sensing line SLj to the source electrode of the driving transistor DT. A gate electrode of the second transistor ST2 may be connected to the kth sensing signal line SSk, a first electrode may be connected to the $j^{th}$ sensing line SLj, and a second electrode may be connected to the source electrode of the driving transistor DT. The second transistor ST2 may be referred to as a sensing transistor.

The capacitor C may be provided between the gate electrode and the source electrode of the driving transistor DT. The capacitor C may store a difference voltage between a gate voltage and a source voltage of the driving transistor DT.

In FIG. 2, an example where the driving transistor DT and the first and second transistors ST1 and ST2 are each implemented as an N-type metal oxide semiconductor field effect transistor (MOSFET) has been described, but the present disclosure is not limited thereto. The driving transistor DT and the first and second transistors ST1 and ST2 may each be implemented as a P-type MOSFET. Also, the first electrode may be a source electrode, and the second electrode may be a drain electrode. However, the present embodiment is not limited thereto. In other embodiments, the first electrode may be a drain electrode, and the second electrode may be a source electrode.

In the display mode, when the scan signal is supplied to the $k^{th}$ scan line Sk, the data voltage VDATA of the jth data line DLj may be supplied to the gate electrode of the driving transistor DT, and when the sensing signal is supplied to the kth sensing signal line SSk, an initialization voltage of the $j^{th}$ sensing line SLj may be supplied to the source electrode of the driving transistor DT. Therefore, in the display mode, a current of the driving transistor DT which flows according to a voltage difference between a voltage at the gate electrode and a voltage at the source electrode of the driving transistor DT may be supplied to the organic light emitting diode OLED, and the organic light emitting diode OLED may emit light with the current of the driving transistor DT. In this case, the data voltage VDATA may be a voltage generated by compensating for a threshold voltage and an electron mobility of the driving transistor DT, and thus, the current of the driving transistor DT does not depend on the threshold voltage and electron mobility of the driving transistor DT.

In the sensing mode, when the scan signal is supplied to the kth scan line Sk, a sensing voltage of the $j^{th}$ data line DLj may be supplied to the gate electrode of the driving transistor DT, and when the sensing signal is supplied to the $k^{th}$ sensing signal line SSk, the initialization voltage of the $j^{th}$ sensing line SLj may be supplied to the source electrode of the driving transistor DT. Also, when the sensing signal is supplied to the $k^{th}$ sensing signal line SSk, the second transistor ST2 may be turned on and may allow the current of the driving transistor DT, which flows according to the voltage difference between the voltage at the gate electrode and the voltage at the source electrode of the driving transistor DT, to flow to the $j^{th}$ sensing line SLj.

The gate driver 20 may be supplied with a gate driver control signal GCS from the timing controller 40 and may generate gate signals (or scan signals) according to the gate driver control signal GCS to supply the gate signals to the gate lines GL1 to GLp.

The data driver 30 may be supplied with a data driver control signal DCS from the timing controller 40 and may generate data voltages according to the data driver control signal DCS to supply the data voltages to the data lines DL1 to DLq. Also, the data driver 30 may sense a voltage and current characteristic of each of the pixels P to generate sensing data SEN and may supply the sensing data SEN to the timing controller 40.

The timing controller 40 may be supplied with a timing signal TS for controlling an image display timing and digital video data DATA including color-based information for realizing an image from the outside. The timing signal TS and the digital video data DATA may be input to an input terminal of the timing controller 40, based on a predetermined protocol. Also, the timing controller 40 may be supplied with the sensing data SEN based on the voltage and current characteristic of each pixel P from the data driver 30.

The timing signal TS may include a vertical sync signal Vsync, a horizontal sync signal Hsync, a data enable signal DE, and a dot clock DCLK. The timing controller 40 may compensate for the digital video data DATA, based on the sensing data SEN.

The timing controller 40 may generate driver control signals for controlling operation timings of the gate driver 20, the data driver 30, a scan driver, and a sensing driver. The driver control signals may include the gate driver control signal GCS for controlling the operation timing of the gate driver 20, the data driver control signal DCS for controlling the operation timing of the data driver 30, a scan driver control signal for controlling the operation timing of the scan driver, and a sensing driver control signal for controlling the operation timing of the sensing driver.

The timing controller 40 may operate the data driver 30, the scan driver, and the sensing driver in one mode of the display mode and the sensing mode according to a mode signal. The display mode may be a mode in which the pixels P of the display panel 100 display an image, and the sensing mode may be a mode in which a current of a driving transistor DT of each of the pixels P of the display panel 100 is sensed. When a waveform of the scan signal and a waveform of the sensing signal supplied to each of the pixels P are changed in each of the display mode and the sensing mode, the data driver control signal DCS, a scan driver control signal, and a sensing driver control signal may also be changed in each of the display mode and the sensing mode. Therefore, the timing controller 40 may generate the data driver control signal DCS, the scan driver control signal, and the sensing driver control signal according to one mode of the display mode and the sensing mode.

The timing controller 40 may output the gate driver control signal GCS to the gate driver 110. The timing controller 40 may output compensation digital video data and the data driver control signal DCS to the data driver 120. The timing controller 40 may output the scan driver control signal to the scan driver. The timing controller 40 may output the sensing driver control signal to the sensing driver.

Moreover, the timing controller 40 may generate a mode signal for executing one corresponding mode, in which the data driver 30, the scan driver, and the sensing driver are driven, of the display mode and the sensing mode. The timing controller 40 may operate the data driver 30, the scan driver, and the sensing driver in one mode of the display mode and the sensing mode according to the mode signal.

Figure 3:
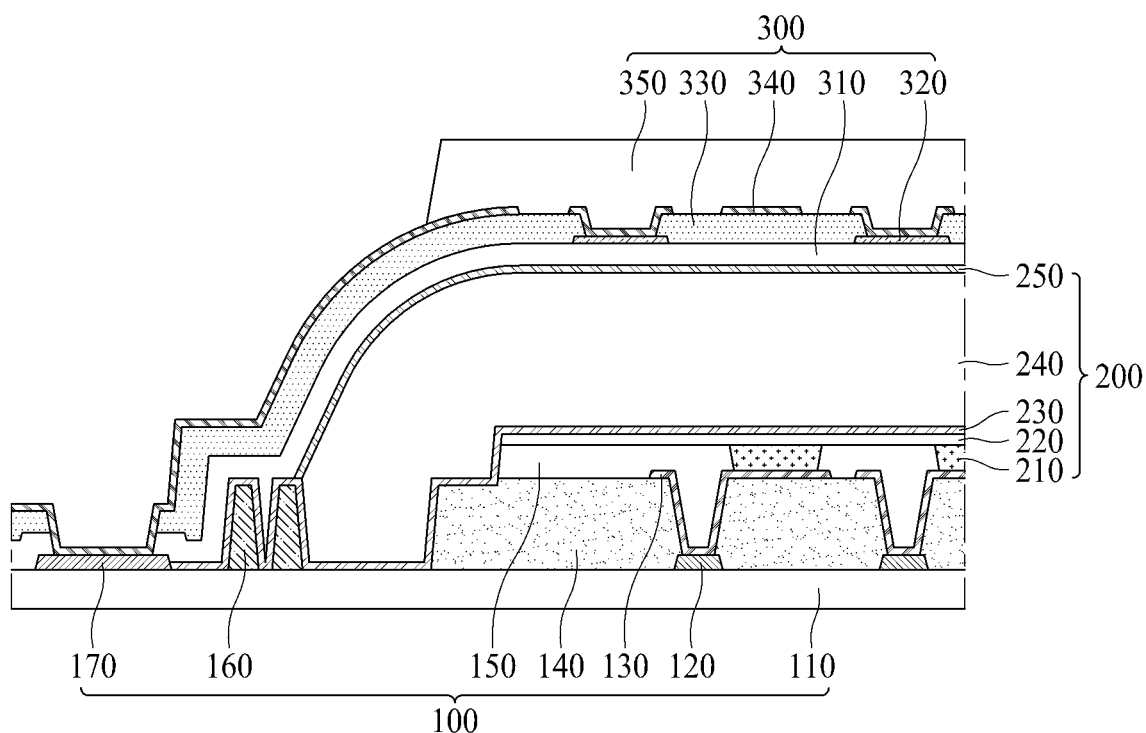
FIG. 3 is a cross-sectional view of a display apparatus with integrated touch screen according to an embodiment of the present disclosure.

FIG. 3 is a cross-sectional view of a display apparatus with integrated touch screen according to an embodiment of the present disclosure. The display apparatus with integrated touch screen according to an embodiment of the present disclosure may include a lower substrate 100, a middle substrate 200, and a touch screen 300.

The lower substrate 100 may support a rear surface of the display apparatus with integrated touch screen. A thin film transistor (TFT) configuring a pixel may be provided on the lower substrate 100.

A polyimide layer 110 may be disposed on a lowermost end of the lower substrate 100. The polyimide layer 110 may have flexibility. The polyimide layer 110 may absorb an impact applied to the rear surface of the lower substrate 100.

A data line 120 may be disposed on the polyimide layer 110. The data line 120 may be provided in plurality, and each of the plurality of data lines may be disposed in each of pixel columns. The data line 120 may transfer a data voltage to a corresponding pixel.

An anode electrode 130 may be disposed on the data line 120. The anode electrode 130 may be disposed by units of pixels. Anode electrodes 130 disposed in different pixels may not be connected to each other. The anode electrode 130 may be supplied with a data voltage through the data line 120.

The planarization layer 140 may be disposed on the polyimide layer 110. The planarization layer 140 may be disposed at a position at which the data line 120 is not disposed. The planarization layer 140 may have a height higher than the data line 120. An upper surface of the planarization layer 140 may be planar, and the anode electrode 130 may be provided in a portion of the upper surface of the planarization layer 140. The anode electrode 130 may be provided on the planarization layer 140 in a state where the anode electrode 130 is not connected to and is disconnected from an adjacent anode electrode 130.

A bank 150 may be disposed on the anode electrode 130 and the planarization layer 140. The bank 150 may divide each of the pixels. The bank 150 may be formed of a material having good insulating properties. Therefore, the bank 500 prevents short circuit between anode electrodes 130 disposed adjacent to each other.

A dam 160 may be disposed on the polyimide layer 110. The dam 160 may be disposed in an edge region of the lower substrate 100. The dam 160 prevents a material, having flowability among materials of the pixels, from passing over an edge of the lower substrate 100. Also, the dam 160 prevents materials, used to manufacture elements outside the pixels, from penetrating into a pixel area.

A pad part 170 may be disposed on the polyimide layer 110. The pad part 170 may be disposed outside the dam 160 in the edge region of the lower substrate 100. The pad part 170 may be a means for inputting a signal to an integrated circuit (IC) chip or a TFT provided on the lower substrate 100. For example, the pad part 170 may supply a gate signal and a data signal, supplied from the outside, to the lower substrate 100.

The middle substrate 200 may be disposed on the lower substrate 100. The middle substrate 200 may implement a color of the display apparatus with integrated touch screen and protects a front surface of the lower substrate 100.

A light emitting layer 210 may be disposed on the anode electrode 130. The light emitting layer 210 may be disposed in each pixel. The light emitting layer 210 may emit light of a predetermined color by using an internal material or a means such as a color filter disposed thereon. The light emitting layer 210 may emit light in accordance with a level of a voltage or an external signal. Therefore, driving of the light emitting layer 210 may be controlled in accordance with a voltage of the anode electrode 130. Particularly, if the display apparatus with integrated touch screen according to an embodiment of the present disclosure is a self-emitting display apparatus such as an organic light emitting display apparatus, the light emitting layer 210 may be controlled to emit light having desired brightness with a data voltage which is transferred via the anode electrode 130 from the data line 120.

A cathode electrode 220 may be disposed on the bank 150 and the light emitting layer 210. The cathode electrode 220 may be provided as a single electrode in the plurality of pixels. The cathode electrode 220 may supply a reference voltage or a common voltage to the pixels.

A first passivation layer 230 may be disposed on the cathode electrode 230 in a region where the pixels are provided. Also, the first passivation layer 230 may be disposed on the polyimide layer 110 and the dam 160 in a region where the pad part 170 is disposed. The first passivation layer 230 protects TFTs provided in the pixels on the lower substrate 100. Also, the first passivation layer 230 prevents the external exposure of an upper portion of each of the polyimide layer 110 and the dam 160 in the region where the pad part 170 is disposed, thereby protecting the polyimide layer 110 and the dam 160.

An encapsulation layer 240 may be disposed on the first passivation layer 230. The encapsulation layer 240 may be provided in a pixel area. The encapsulation layer 240 protects the TFTs, provided in the pixels, from external foreign materials such as oxygen, water, etc.

A second passivation layer 250 may be disposed on the encapsulation layer 240. The second passivation layer 250 protects the encapsulation layer 240 from an external impact.

The touch screen 300 may be disposed on the middle substrate 200. The touch screen 300 may sense external touch information provided by a finger of a user or a touch pen. When a top of the touch screen 300 is touched, a capacitance formed in the encapsulation layer 240 disposed between the touch screen 300 and the lower substrate 100 may vary, and thus, touch information can be sensed. Also, the touch screen 300 may display the external touch information on the pixel area.

A first insulation layer 310 may be disposed on the second passivation layer 250 in the pixel area. Also, the first insulation layer 310 may be disposed on the first passivation layer 230 in the region where the pad part 170 is disposed.

The first insulation layer 310 prevents short circuit between lines provided under the touch screen 300.

A touch line 320 may be disposed on the first insulation layer 310. The touch line 320 may be disposed in a direction parallel to the data line. The touch line 320 may supply a touch driving signal for driving the touch screen 300. Also, the touch line 320 may transfer touch information, sensed by the touch screen 300, to a touch IC chip. The touch line 320 may be formed of a material having high electrical conductivity.

A second insulation layer 330 may be disposed on the first insulation layer 310 and the touch line 320. The second insulation layer 330 prevents short circuit between adjacent touch lines 320.

A touch electrode 340 may be provided on the touch line 320 and the second insulation layer 330. A touch electrode 340 disposed in a direction parallel to the data line may be disposed on the touch line 320. Also, a touch electrode 340 disposed in a direction parallel to a gate line may be disposed on the second insulation layer 330. The touch electrode 340 disposed in a direction parallel to the data line and the touch electrode 340 disposed in a direction parallel to the gate line may be connected to each other through a bridge electrode, and thus, may have a mesh structure.

A touch electrode 340 disposed in an edge of the pixel area may extend to an upper portion of the pad part 170 and may be electrically connected to the pad part 170. The touch electrodes 340 arranged in a mesh structure may sense a touch position of a touch which is performed in the pixel area. The touch electrode 340 may transfer touch information including the touch position to the pad part 170.

An upper film 350 may be disposed on the second insulation layer 330 and the touch electrode 340. The upper film 350 may cover the second insulation layer 330 and the touch electrode 340 so as not to be externally exposed. The upper film 350 protects the second insulation layer 330 and the touch electrode 340 from external foreign materials such as oxygen, water, etc.

Figure 4:
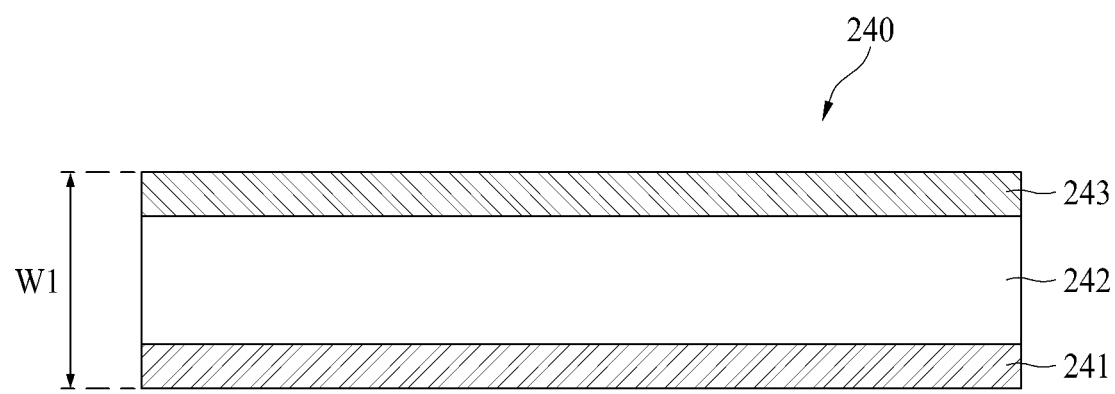
FIG. 4 is a cross-sectional view of an encapsulation layer according to an embodiment of the present disclosure.

FIG. 4 is a cross-sectional view of an encapsulation layer 240 according to an embodiment of the present disclosure. The encapsulation layer 240 may include a first elastic layer 241 disposed on the light emitting layer 210, a low dielectric layer 242 disposed on the first elastic layer 241, and a second elastic layer 243 disposed on the low dielectric layer 242.

Particularly, a relative permittivity of the low dielectric layer 242 according to an embodiment of the present disclosure may be 2.5 to 2.8. A relative permittivity may be a ratio of a permittivity of an objective material and permittivity in vacuum and may be proportional to a capacitance of the objective material. The low dielectric layer 242 according to an embodiment of the present disclosure may use a material having relative permittivity which is lower than that of materials having an encapsulation function in the related art. More detailed features of the low dielectric layer 242 according to an embodiment of the present disclosure will be described in more detail with reference to FIGS. 5 and 7.

A relative permittivity of the materials having the encapsulation function in the related art may be 3.4 to 3.6. A touch sensitivity of the touch screen 300 may be inversely proportional to the square of an initial capacitance of the encapsulation layer 240 disposed between the touch screen 300 and the lower substrate 100. As a thickness of the encapsulation layer 240 increases and a relative permittivity of the encapsulation layer 240 decreases, touch sensitivity is enhanced. A material which is currently used when forming the encapsulation layer 240 may be an acryl copolymer having alkali solubility. A relative permittivity of the acryl copolymer may be 3.4 to 3.6. A touch sensitivity of the encapsulation layer 240 formed of the acryl copolymer may be about 36.0 dB with respect to a signal-to-noise ratio (SNR).

In comparison with this, if relative permittivity is 2.5 to 2.8 like the low dielectric layer 242 according to an embodiment of the present disclosure, touch sensitivity can be improved. Considering an experiment result, if the low dielectric layer 242 according to an embodiment of the present disclosure is applied, an SNR has been enhanced by 40.0 dB in comparison with a case where elements other than the encapsulation layer 240 are identically applied, and touch sensitivity has been enhanced by about 10% in comparison with conventional materials. Therefore, according to an embodiment of the present disclosure, a display apparatus with integrated touch screen for easily sensing a user touch is provided.

A thickness of the encapsulation layer 240 according to an embodiment of the present disclosure may be 4 μm to 4.5 μm. According to an embodiment of the present disclosure, the thickness of the encapsulation layer 240 has been reduced by about 50% in comparison with the related art where a thickness of an encapsulation layer is 8 μm to 10 μm. The above-described experiment result is a result obtained when the thickness of the encapsulation layer 240 according to an embodiment of the present disclosure is 4 μm to 4.5 μm.

In the conventional art, since a material having high relative permittivity is used, an encapsulation layer should be formed to have a certain thickness or more. Therefore, according to an embodiment of the present disclosure, the thickness of the encapsulation layer 240 may be set thinner than the related art. Accordingly, in the display apparatus with integrated touch screen according to an embodiment of the present disclosure, a weight of the encapsulation layer 240 may be reduced in a case of being applied to a product including a large screen, thereby decreasing a total weight of the product.

If the encapsulation layer 240 is formed of a single layer including the low dielectric layer 242, touch sensitivity is improved, but there is no flexibility. For this reason, the display apparatus with integrated touch screen becomes vulnerable to an external impact, and bending for decreasing an impact applied to the pixel area is not easily performed. In order to solve such a problem, the encapsulation layer 240 according to an embodiment of the present disclosure may additionally include the first elastic layer 241 disposed on the low dielectric layer 242 and the second elastic layer 243 disposed under the low dielectric layer 242.

The first elastic layer 241 and the second elastic layer 243 may decrease an external stress applied to the low dielectric layer 242. The first elastic layer 241 and the second elastic layer 243 may each be formed of resin having an excellent elastic force. For example, the first elastic layer 241 and the second elastic layer 243 may be formed urethane acrylate, urethane methacrylate, and/or the like. Urethane acrylate or urethane methacrylate has an excellent elastic force and enables the first elastic layer 241 and the second elastic layer 243 to have a thin thickness which enables the first elastic layer 241 and the second elastic layer 243 to be disposed adjacent to the low dielectric layer 242.

In an embodiment of the present disclosure, the first elastic layer 241 and the second elastic layer 243 each having an excellent elastic force may be respectively disposed on and under the low dielectric layer 242. Particularly, by introducing an elastic resin including urethane acrylate or urethane methacrylate, a stress applied to an upper portion and a lower portion of the low dielectric layer 242 is reduced when bending is performed, thereby solving a problem where damage such as a crack occurs in TFTs and a problem where a thin layer is partially detached. Accordingly, a yield rate of products is enhanced.

Figure 5:
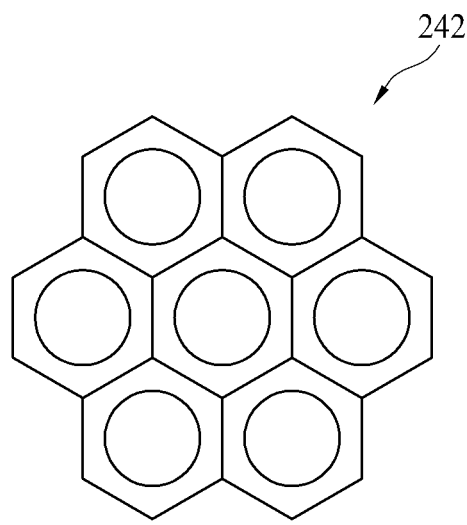
FIG. 5 is a diagram illustrating a structure of a low dielectric layer according to an embodiment of the present disclosure.
Figure 6:
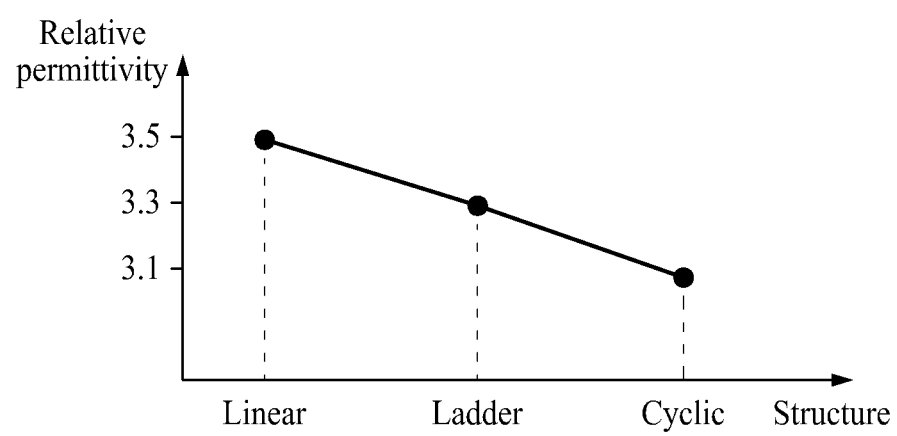
FIG. 6 is a graph showing a relative permittivity with respect to a structure of a low dielectric layer according to an embodiment of the present disclosure.
Figure 7:
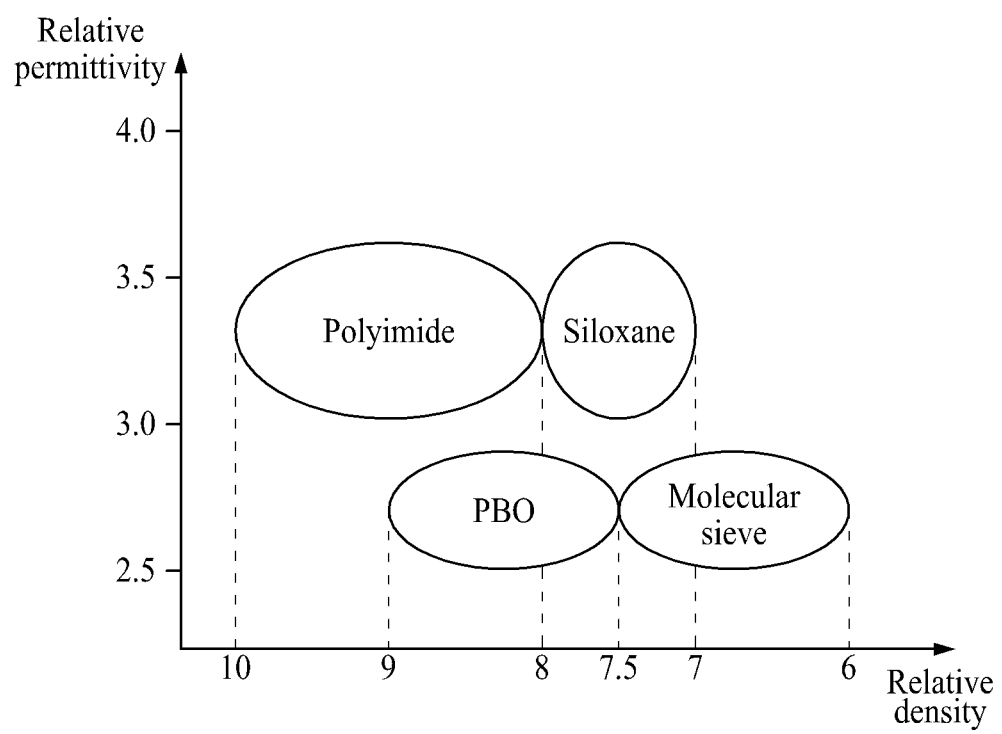
FIG. 7 is a graph showing a relative density and a relative permittivity of materials included in a low dielectric layer according to an embodiment of the present disclosure.

FIG. 5 is a diagram illustrating a structure of a low dielectric layer 242 according to an embodiment of the present disclosure. FIG. 6 is a graph showing a relative permittivity with respect to a structure of the low dielectric layer 242 according to an embodiment of the present disclosure. FIG. 7 is a graph showing a relative density and a relative permittivity of materials included in the low dielectric layer 242 according to an embodiment of the present disclosure.

The low dielectric layer 242 according to an embodiment of the present disclosure may include a siloxane copolymer, and a composition material included in the low dielectric layer 242 may use a siloxane polymer coupling agent including a Si—O bond.

The Si—O bond of the siloxane copolymer has a coupling energy which is higher than that of a C—C bond of an acryl-based polymer. Also, the Si—O bond of the siloxane copolymer has a coupling length which is longer than that of the C—C bond of the acryl-based polymer. Therefore, if the siloxane copolymer is used as a binder, the low dielectric layer 242 has a bulky characteristic. As a result, if the siloxane copolymer is used as the binder, a packing density is reduced. If a packing density of a specific material is low, an effect such as being similar to a vacuum state is obtained. That is, an ability to charge an electrical charge into a material is reduced. Accordingly, if a packing density is reduced, relative permittivity is reduced.

Since the low dielectric layer 242 according to an embodiment of the present disclosure includes the siloxane copolymer, a packing density is reduced in comparison with materials of the related art, and thus, relative permittivity is reduced, thereby implementing a layer which is low in relative permittivity.

Moreover, the low dielectric layer 242 according to an embodiment of the present disclosure may use, as a binder, a silicon copolymer having a heat resistance which is higher than that of the acryl-based polymer used as a conventional material of the encapsulation layer 240.

In an embodiment of the present disclosure, the inventors have developed a material capable of being applied to TFTs, requiring a low temperature process performed at a temperature lower than 100° C., among silicon polymers without any change in physical properties of a PCL material and have applied the developed material to the low dielectric layer 242. A material of the low dielectric layer 242 provided on a TFT and an organic light emitting device should fundamentally maintain a function smoothly applied to a touch-on encapsulation (ToE) panel where a touch screen is provided on an encapsulation layer.

To this end, the low dielectric layer 242 should have a low dielectric constant, and moreover, should maintain thickness stability, an adhesive force to an adjacent layer, a bending characteristic, and a light transmittance so as to act as an encapsulation layer. The siloxane copolymer, the siloxane polymer coupling agent, and the silicon polymer coupling agent included in the low dielectric layer 242 according to an embodiment of the present disclosure satisfy the above-described characteristics.

Since a packing density is a density including a space which is provided between individual particles when filling a three-dimensional space having volume, a value of the packing density varies based on a filling method or a coupling method despite using the same material.

The low dielectric layer 242 may have a cyclic coupling structure. As in FIG. 6, the cyclic coupling structure is lower in relative permittivity than a linear coupling structure and a ladder coupling structure. The reason is because in comparison with the linear coupling structure or the ladder coupling structure, there are a number of spaces between individual particles in the cyclic coupling structure.

FIG. 6 is a graph showing an experiment result obtained by measuring a relative permittivity of the low dielectric layer 242 including a siloxane polymer. In the experiment result, relative permittivity is 3.5 in case where the low dielectric layer 242 has a linear molecule coupling structure, relative permittivity is 3.3 in case where the low dielectric layer 242 has a ladder molecule coupling structure, and relative permittivity is 3.1 in case where the low dielectric layer 242 has a cyclic molecule coupling structure.

The low dielectric layer 242 according to an embodiment of the present disclosure may have the cyclic molecule coupling structure, and thus, despite using the same material, a space between molecules is widely provided, thereby decreasing a packing density. Accordingly, the low dielectric layer 242 according to an embodiment of the present disclosure may more efficiently realize a low dielectric state.

The low dielectric layer 242 according to an embodiment of the present disclosure may have a molecular sieve structure (MCM). The molecular sieve structure may be a hexagonal structure where an air gap is provided as in FIG. 5. A space having a size of 1 nm to 10 nm is provided in an air gap of the molecular sieve structure. That is, if the low dielectric layer 242 has the molecular sieve structure, porosity is maximized. Accordingly, if the low dielectric layer 242 has the molecular sieve structure, a packing density is more reduced.

Moreover, the molecular sieve structure may be a structure where a hexagonal structure is repeatedly arranged, and thus, in a case where a center of a regular hexagon is defined as a symmetric point or a rectilinear line passing by a center of a regular hexagon is defined as a symmetric line, a point symmetry structure or a line symmetry structure may be implemented. In this case, polarity is minimized. If polarity is small, a coupling force between molecules is weak, and moreover, a coupling length increases in comparison with a case where polarity is large. Accordingly, a packing density of the low dielectric layer 242 according to an embodiment of the present disclosure is more reduced.

Therefore, in the low dielectric layer 242 according to an embodiment of the present disclosure, a packing density is reduced, and relative permittivity is efficiently reduced.

FIG. 7 shows relative permittivity and a relative density which defines a packing density as a relative value with respect to a reference material. A relative density of polyimide is 8 to 10. A relative density of siloxane is 7 to 8. Such materials fundamentally have a relative permittivity of 3.0 to 3.5.

In FIG. 7, a primary objective material including a siloxane copolymer according to an embodiment of the present disclosure is a material to which a molecular sieve structure is not applied, and may be defined as a polymer binder objective (PBO) material. A relative permittivity of the PBO material is 2.5 to 2.8. Here, a relative density is 7.5 to 9.

Here, if the low dielectric layer 242 according to an embodiment of the present disclosure has the molecular sieve structure, relative permittivity is 2.5 to 2.8, and a relative density is reduced by 6 to 7.5.

As described above, an MCM material having the molecular sieve structure may be silicon oxide (silica, $SiO_2$). In the present disclosure, sodium silicate ($Na_2SiO_3$) may be used as an introduction of $SiO_2$. Also, in the present disclosure, by using cetyltrimethylammonium bromide (CTAB) as a surfactant, Si-MCM-41 may be synthesized under a hydrothermal condition. A size of an air gap may be adjusted by treating the synthesized Si-MCM-41 with tetraethylorthosilicate ($Si(O-CH_2CH_3)_4$). A porous material may use a material which is small in fumes on side and is good in heat resistance, for slightly emitting a gas which is injected and occurs in a process of manufacturing an organic light emitting device. Therefore, in order to minimize gas emission and decrease relative permittivity, an MCM porous material may be added to a siloxane coupling agent. Accordingly, material design has been performed so that in-molecule volume is maximized, a packing density is minimized, and relative permittivity is reduced.

Moreover, in the present disclosure, a process characteristic is improved, and a silicon-based surfactant is used for improving the thickness stability of the layers configuring the encapsulation layers 240. Also, by introducing a silane coupling agent so as to improve an adhesive force, an adhesive force between an upper layer and a lower layer is enhanced.

In the display apparatus with integrated touch screen according to the embodiments of the present disclosure, the relative permittivity of the encapsulation layer is reduced, thereby increasing touch sensitivity.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus with integrated touch screen, comprising:
    a substrate including a display area and a non-display area, wherein the non-display area has a dam and a pad disposed outside the dam;
    a light emitting layer disposed over the substrate;
    a first passivation layer on the light emitting layer;
    an encapsulation layer disposed on the first passivation layer, and including a first elastic layer disposed on the first passivation layer, a low dielectric layer disposed on the first elastic layer, a second elastic layer disposed on the low dielectric layer, wherein the low dielectric layer has a relative permittivity in a range of 2.5 and 2.8;
    a second passivation layer on the encapsulation layer, wherein the first passivation layer and the second passivation layer extend to the dam; and
    a touch electrode disposed over the encapsulation layer, and extended to the pad along a side surface of the encapsulation layer.

2. The display apparatus of claim 1, wherein the encapsulation layer has a thickness of 4 μm to 4.5 μm.

3. The display apparatus of claim 1, wherein the first elastic layer and the second elastic layer include urethane acrylate or urethane methacrylate.

4. The display apparatus of claim 1, wherein the low dielectric layer includes siloxane copolymer and a siloxane polymer coupling agent including a Si—O bond.

5. The display apparatus of claim 1, wherein the low dielectric layer includes a cyclic coupling structure.

6. The display apparatus of claim 1, wherein the low dielectric layer includes a molecular sieve structure.

7. The display apparatus of claim 6, wherein the molecular sieve structure has hexagonal structure with an air gap.

8. The display apparatus of claim 7, wherein the air gap has an internal space with a size of 1 nm to 10 nm.

9. The display apparatus of claim 1, wherein the low dielectric layer has a relative density in a range of 6 to 7.5.

10. A display apparatus, comprising:
    a substrate including a display area and a non-display area, wherein the non-display area has a dam and a pad disposed outside the dam;
    a light emitting layer disposed over the substrate;
    a first passivation layer on the light emitting layer;
    an encapsulation layer disposed on the first passivation layer, and including a first elastic layer disposed on the first passivation layer, a low dielectric layer disposed on the first elastic layer, and a second elastic layer disposed on the low dielectric layer, wherein the low dielectric layer has a relative permittivity in a range of 2.5 and 2.8 and a relative density in a range of 6 to 7.5;
    a second passivation layer on the encapsulation layer, wherein the first passivation layer and the second passivation layer extend to the dam; and
    a touch electrode disposed over the encapsulation layer, and extended to the pad along a side surface of the encapsulation layer.

11. The display apparatus of claim 10, wherein the encapsulation layer has a thickness of 4 μm to 4.5 μm.

12. The display apparatus of claim 10, wherein the first elastic layer and the second elastic layer include urethane acrylate or urethane methacrylate.

13. The display apparatus of claim 10, wherein the low dielectric layer includes siloxane copolymer and a siloxane polymer coupling agent including a Si—O bond.

14. The display apparatus of claim 10, wherein the low dielectric layer includes a cyclic coupling structure.

15. The display apparatus of claim 10, wherein the low dielectric layer includes a molecular sieve structure.

16. The display apparatus of claim 15, wherein the molecular sieve structure has hexagonal structure with an air gap.

17. The display apparatus of claim 16, wherein the air gap has an internal space with a size of 1 nm to 10 nm.

18. An encapsulating layer of a display apparatus, comprising:
    a first elastic layer disposed over a light emitting layer;
    a low dielectric layer disposed on the first elastic layer; and
    a second elastic layer disposed on the low dielectric layer, wherein the low dielectric layer has a relative permittivity in a range of 2.5 and 2.8 and a relative density in a range of 6 to 7.5, and the first elastic layer and the second elastic layer are non-piezoelectric polymers and the low dielectric layer is non-elastic.

19. The display apparatus of claim 18, wherein the first elastic layer and the second elastic layer include urethane acrylate or urethane methacrylate.

20. The display apparatus of claim 18, wherein the low dielectric layer includes siloxane copolymer and a siloxane polymer coupling agent including a Si—O bond.

* * * * *